(12) United States Patent
Shin et al.

(10) Patent No.: US 7,807,543 B2
(45) Date of Patent: *Oct. 5, 2010

(54) METHODS OF MANUFACTURING TRENCH ISOLATION STRUCTURES USING SELECTIVE PLASMA ION IMMERSION IMPLANTATION AND DEPOSITION (PIIID)

(75) Inventors: Dong-woon Shin, Gyeonggi-do (KR);
Tai-su Park, Gyeonggi-do (KR);
Si-young Choi, Gyeonggi-do (KR);
Soo-jin Hong, Gyeonggi-do (KR);
Mi-jin Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 155 days.

This patent is subject to a terminal disclaimer.

(21) Appl. No.: 12/134,760

(22) Filed: Jun. 6, 2008

(65) Prior Publication Data
US 2009/0203189 A1    Aug. 13, 2009

(30) Foreign Application Priority Data
Feb. 13, 2008   (KR) ............ 10-2008-0013007

(51) Int. Cl.
H01L 21/76   (2006.01)
(52) U.S. Cl. .......... 438/400; 438/424; 257/E21.546
(58) Field of Classification Search .......... 438/400, 438/424, 432; 257/E21.546
See application file for complete search history.

(56) References Cited

U.S. PATENT DOCUMENTS 6,486,039 B2    11/2002  Yoo et al.
2002/0070430 A1 *  6/2002  Oh et al. ............ 257/622

FOREIGN PATENT DOCUMENTS

| JP | 2001-15618 A | 1/2001 |
| KR | 10-0378190 B1 | 3/2003 |
| KR | 10-0479813 B1 | 1/2005 |

OTHER PUBLICATIONS

Volz and Ensinger, "Growth of the carbide, nitride and oxide of silicon by plasma immersion ion implantation," Surface and Coating Technology 156, 2002, pp. 237-243.*

* cited by examiner

Primary Examiner—Asok K Sarkar
Assistant Examiner—Julia Slutsker
(74) Attorney, Agent, or Firm—Myers Bigel Sibley & Sajovec, P.A.

(57) ABSTRACT

A semiconductor device is manufactured by forming trenches in a substrate and selectively performing Plasma Ion Immersion Implantation and Deposition (PIIID) on a subset of the trenches in the substrate. The PIIID may be performed on only a portion of a surface of at least one of the trenches in the substrate. Semiconductor devices can include a semiconductor substrate having first, second and third trenches therein, and an oxide liner layer that fully lines the first trenches, that does not line the second trenches and that partially lines the third trenches.

16 Claims, 7 Drawing Sheets

US 7,807,543 B2

METHODS OF MANUFACTURING TRENCH ISOLATION STRUCTURES USING SELECTIVE PLASMA ION IMMERSION IMPLANTATION AND DEPOSITION (PIIID)

CROSS-REFERENCE TO RELATED PATENT APPLICATION

This application claims priority under 35 USC §119 to Korean Patent Application No. 10-2008-0013007, filed on Feb. 13, 2008, the disclosure of which is hereby incorporated herein by reference in its entirety as if set forth fully herein.

FIELD OF THE INVENTION

The present invention relates to methods of manufacturing semiconductor devices, and more particularly, to methods of manufacturing trench isolation structures for semiconductor devices, and devices so fabricated.

BACKGROUND OF THE INVENTION

In general, semiconductor (microelectronic) devices can include an active region in which unit devices are formed, and a device isolation region that defines the unit devices. The device isolation region accounts for a large proportion of a total area of semiconductor devices, and thus miniaturization of the device isolation region may be desired for high integration of semiconductor devices. In addition, in order to ensure that devices properly operate, a device isolation region should have a structure that can reduce or prevent interference between devices and decrease junction capacitance. In the past, Local Oxidation of Silicon (LOCOS) type oxide layers were used as a device isolation layer of semiconductor devices. Moreover, shallow trench isolation (STI) type device isolation layers that have a narrow width and can have excellent device isolation properties are widely used.

FIG. 1 is a schematic cross-sectional view of a semiconductor device including a conventional STI-type device isolation layer.

Referring to FIG. 1, device isolation layers 2 are formed in a substrate 1. An active region 3 including a source/drain region and a channel region is formed between the device isolation layers 2, and a gate structure 9 is formed on the active region 3. Such device isolation layers 2 are filled with insulating material, and thus electrically separate the devices from each other. In detail, as illustrated in FIG. 1, a silicon oxide layer 4 and a silicon nitride layer 6 may be formed on inner walls of the device isolation layer 2. And then, the device isolation layer 2 is filled with a buried layer 8 having a gap fill material such as spin-on-glass (SOG).

However, the silicon nitride layer 6 may trap electrons ($e^-$), and thus electrons are trapped at an interface between the silicon oxide layer 4 and the silicon nitride layer 6. Accordingly, holes ($h^+$) are concentrated in a region of the substrate 1 adjacent to the device isolation layer 2 due to the trapped electrons. This is referred to as hot electron induced punch-through (HEIP). Due to the HEIP, current may flow even when a voltage is not applied to a gate 9, and thus a threshold voltage may decrease and leakage current may increase, resulting in defective devices. Such a HEIP phenomenon may be especially problematic in a p-channel metal-oxide-semiconductor (p-MOS) device in which holes are the majority carrier and Vpp is applied at a high voltage, and in particular, off-current characteristics may be degraded. To address these problems, methods of increasing the thickness of a silicon oxide layer in order to reduce or prevent electrons from becoming trapped in a silicon nitride layer have been proposed. However, there may be limits on forming of the silicon oxide layer having a large thickness, which can reduce a gap fill margin of device isolation layers of a cell region, particularly.

SUMMARY OF THE INVENTION

Some embodiments of the present invention provide methods of manufacturing semiconductor devices by forming trenches in a substrate and selectively performing Plasma Ion Immersion Implantation and Deposition (PIIID) on a subset of the trenches in the substrate. Moreover, in some embodiments, the PIIID is performed on only a portion of a surface of at least one of the trenches in the substrate. Semiconductor devices according to other embodiments of the invention include a semiconductor substrate having first, second and third trenches therein, and an oxide liner layer that fully lines the first trenches, that does not line the second trenches and that partially lines the third trenches.

According to other embodiments of the present invention, first trenches and second trenches are formed in the substrate and a first oxide layer is formed on the surfaces of the first trenches and the second trenches. A second oxide layer is selectively formed on the first oxide layer formed on the surfaces of the first trenches, but not on the first oxide layer formed on the surfaces of the second trenches, by using plasma ion immersion implantation and deposition (PIIID). A liner nitride layer is formed on the first oxide layer on the surfaces of the second trenches and the second oxide layer on the surfaces of the first trenches. A buried insulating layer is formed in the first trenches and the second trenches. The buried insulating layer is planarized to form a first device isolation layer in the first trenches and a second device isolation layer in the second trenches.

The selective forming of the second oxide layer may further comprise forming a photoresist pattern on the substrate to expose the first trenches and cover the second trenches; forming the second oxide layer on the first oxide layer formed on the surfaces of the exposed first trenches but not on the first oxide layer formed on the surfaces of the covered second trenches by using plasma ion immersion implantation and deposition (PIIID); and removing the photoresist pattern. Before the removing of the photoresist pattern, some embodiments may further comprise removing the second oxide layer formed on the photoresist pattern by using dry etching.

The plasma ion immersion implantation and deposition (PIIID) may be performed at between about 10° C. and about 200° C. In addition, the second oxide layer may be formed using $SiH_4$, $Si_2Cl_2H_2$, $SiH_6$, $Si_2H_6$, $Si_3H_8$, $O_2$, $N_2$, Ar, and/or He.

A region of the substrate between the first device isolation layers may comprise a p-channel metal-oxide-semiconductor (p-MOS) region in which a p-MOS transistor is formed, and a region on the substrate between the second device isolation layers may comprise an n-channel metal-oxide-semiconductor (n-MOS) region in which an n-MOS transistor is formed.

Some of the first trenches may comprise third trenches, wherein the second oxide layer is formed on a part of the first oxide layer formed on the surfaces of the third trenches, and third device isolation layers are formed in the third trenches. In addition, regions in the substrate between the first device isolation layers and a portion of the third device isolation layers having both the first oxide layer and the second oxide layer formed therein may comprise a p-MOS region in which a p-MOS transistor is formed, and regions in the substrate between the second device isolation layers and a portion of the third device isolation layers having the first oxide layer formed therein may comprise an n-MOS region in which an n-MOS transistor is formed. Stated differently, the second oxide layer may be formed on a portion of the first oxide layer formed on the surfaces of a subset of the first trenches. Moreover, regions on the substrate between the first trenches and some of the subset of the first trenches comprise a PMOS region, and regions on the substrate between the second trenches and some of the subset of the first trenches comprise NMOS regions.

The methods of manufacturing a semiconductor device may further comprise forming a pad insulating layer on the substrate.

According to other embodiments of the present invention, first peripheral region trenches and second peripheral region trenches are formed in a peripheral region of a substrate and cell region trenches are formed in a cell region of the substrate. A first oxide layer is formed on the surfaces of the first peripheral region trenches, the second peripheral region trenches and the cell region trenches. A second oxide layer is selectively formed on the first oxide layer formed on the surface of the first peripheral region trenches but not on the first oxide layer formed on the surfaces of the second peripheral region trenches and not on the first oxide layer formed on the surfaces of the cell region trenches by using plasma ion immersion implantation and deposition (PIIID). A liner nitride layer is formed on the first oxide layer and the second oxide layer. A buried insulating layer is formed in the first peripheral region trenches, the second peripheral region trenches and the cell region trenches. The buried insulating layer is planarized to form a first peripheral region device isolation layer in the first peripheral region trenches, a second peripheral region device isolation layer in the second peripheral region trenches and a cell region device isolation layer in the cell region trenches.

The sizes of the first peripheral region trenches and the second peripheral region trenches may be larger than the size of the cell region trenches in some embodiments.

The selective forming of the second oxide layer may further comprise forming a photoresist pattern on the substrate to expose the first peripheral region trenches but to cover the second peripheral region trenches and the cell region trenches; forming the second oxide layer on the first oxide layer formed on the surfaces of the exposed first peripheral region trenches but not on the first oxide layer formed on the surfaces of the covered second peripheral region trenches and cell region trenches by using the plasma ion immersion implantation and deposition (PIIID); and removing the photoresist pattern. In addition, before the removing of the photoresist pattern, the methods may remove the second oxide layer formed on the photoresist pattern by using dry etching.

The plasma ion immersion implantation and deposition (PIIID) may be performed at between about 10° C. to about 200° C. In addition, the second oxide layer may be formed using $SiH_4$, $Si_2Cl_2H_2$, $SiH_6$, $Si_2H_6$, $Si_3H_8$, $O_2$, $N_2$, Ar, and/or He.

Regions on the substrate between the first peripheral region device isolation layers may comprise a p-MOS region in which a P-MOS transistor is formed, regions on the substrate between the second peripheral region device isolation layers may comprise an n-MOS region in which an n-MOS transistor is formed, and regions on the substrate between the cell region device isolation layers may comprise an n-MOS region in which an n-MOS transistor is formed.

Some of the first peripheral region trenches may comprise third peripheral region trenches, wherein the second oxide layer is formed on a part of the first oxide layer formed on the surface of the third peripheral region trenches and third device isolation layers are formed in the third peripheral region trenches. Stated differently, the second oxide layer may be formed on a portion of the first oxide layer, formed on the surfaces of a subset of the first peripheral region trenches.

Regions on the substrate between the first peripheral region device isolation layers and a portion of the third peripheral region device isolation layers having both the first oxide layer and the second oxide layer formed therein may comprise a p-MOS region in which a p-MOS transistor is formed, and regions on the substrate between the second peripheral region device isolation layers and a portion of the third peripheral region device isolation layers having the second oxide layer not formed therein may comprise an n-MOS region on which an n-MOS transistor is formed. Stated differently, regions on the substrate between the first trenches and some of a subset of the first trenches comprise a PMOS region, whereas regions on the substrate between the second trenches and some of the subset of the first trenches may comprise an NMOS region.

The methods of manufacturing a semiconductor device may further comprise forming a pad insulating layer on the substrate.

The methods of manufacturing a semiconductor device may further comprise forming a peripheral region gate structure on regions on the substrate between the first peripheral region device isolation layers and the second peripheral region device isolation layers; and forming a cell region gate structure on regions on the substrate between the cell region device isolation layers.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
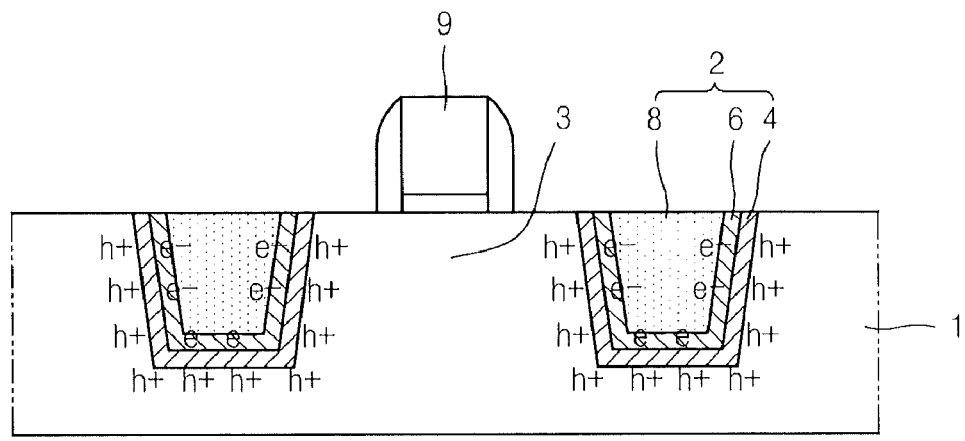
FIG. 1 is a schematic cross-sectional view of a semiconductor device including a conventional shallow trench isolation (STI) type device isolation layer.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In general, a semiconductor memory device may include transistors in a cell array region and transistors in a core circuit region/peripheral circuit region, which can operate and control the transistors in the cell array region. In addition, since a different design rule may be applied to each circuit region depending on the desired degree of integration, the material and/or structure of transistors formed in each circuit region may be different from each other. Hereinafter, the core circuit region/peripheral circuit region is referred to as a peripheral region 100, and the cell array region is referred to as a cell region 200. In addition, a shallow trench isolation (STI) type device isolation layer is also referred to as a device isolation layer.

FIGS. 2A through 2G are cross-sectional views sequentially illustrating methods of manufacturing semiconductor devices including an STI-type device isolation layer according to various embodiments of the present invention, and devices so fabricated.

Figure 2A:
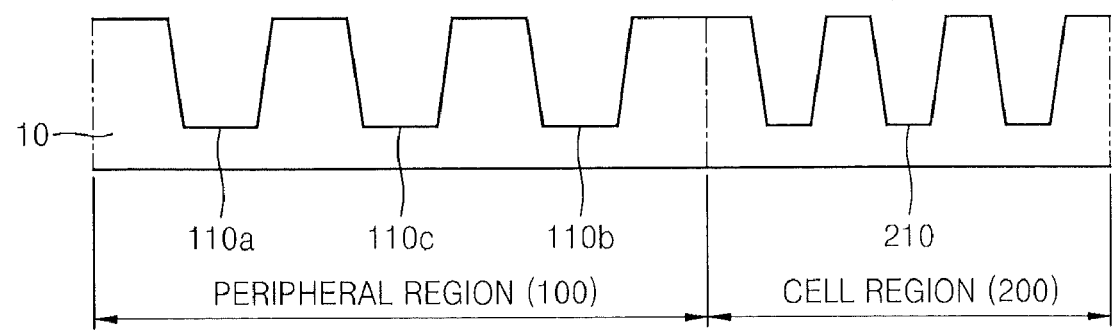
FIGS. 2A through 2G are cross-sectional views sequentially illustrating methods of manufacturing semiconductor devices including an STI-type device isolation layer, according to various embodiments of the present invention and devices so fabricated.

Referring to FIG. 2A, a substrate 10 is prepared. The substrate may be any conventional microelectronic substrate. As illustrated in FIG. 2A, a peripheral region 100 and a cell region 200 are defined. Hereinafter, for brief and concrete explanation of the present invention, as an example of describing methods of manufacturing semiconductor devices according to various embodiments of the present invention, the substrate 10 in which the peripheral region 100 and the cell region 200 are defined is employed. However, this is for illustration only, and the present invention is not limited thereto.

Next, first through third peripheral region trenches 110a, 110b and 110c and cell region trenches 210 are respectively formed in the peripheral region 100 and the cell region 200 of the substrate 10. The first through third peripheral region trenches 110a, 110b and 110c and cell region trenches 210 may be formed simultaneously or in separate processes. The first through third peripheral region trenches 110a, 110b and 110c and the cell region trenches 210 may be formed by using a conventional etching method such as the use of a photoresist mask or a hard mask, and/or the use of wet etching and/or dry etching. Examples of the etching method used for forming the first through third peripheral region trenches 110a, 110b and 110c and cell region trenches 210 include anisotropic etching such as reactive ion etching (RIE) and/or plasma etching, and/or sloped etching. However, these examples are for illustration purposes only, and the present invention is not limited thereto. In addition, the first through third peripheral region trenches 110a, 110b and 110c may be classified according to the structure of layers formed on the surface thereof, and the shapes or sizes thereof are not limited. That is, the first through third peripheral region trenches 110a, 110b and 110c may have shapes or sizes the same as or different from each other. In addition, the shape or size of the first peripheral region trenches 110a may be the same as or different from each other. This also applies to the second peripheral region trenches 110b, the third peripheral region trenches 110c, and the cell region trenches 210. The sizes of the first through third peripheral region trenches 110a, 110b and 110c may be larger than that of the cell region trenches 210. Herein, the size refers to the width and/or depth of the trenches.

Figure 2B:
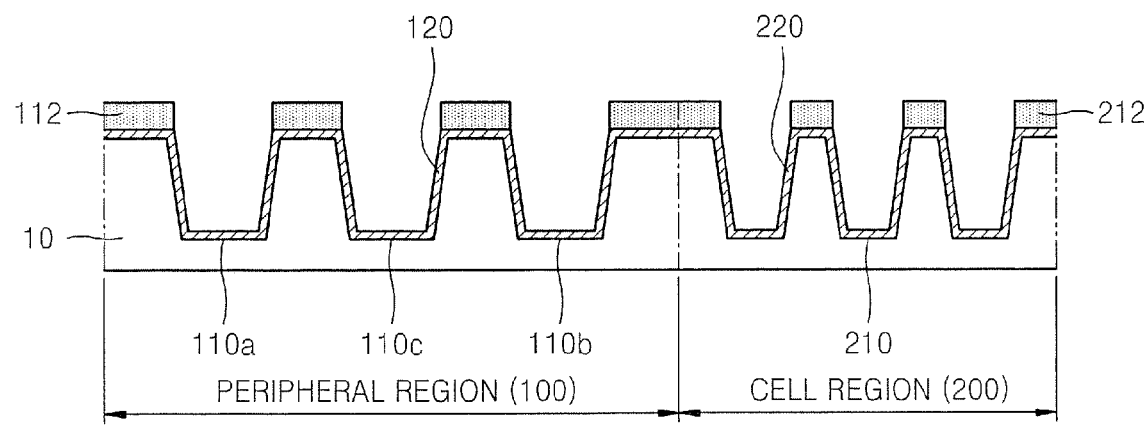

Referring to FIG. 2B, first oxide layers 120 and 220 are respectively formed on the surfaces of the first through third peripheral region trenches 110a, 110b and 110c and cell region trenches 210. Herein, the surfaces of the first through third peripheral region trenches 110a, 110b and 110c and cell region trenches 210 include inner wall (sidewall) surfaces and bottom (floor) surfaces. Other embodiments need not include a bottom surface. The first oxide layers 120 and 220 may be formed on the surfaces of the first through third peripheral region trenches 110a, 110b and 110c and cell region trenches 210 simultaneously or in separate processes. In addition, the widths or materials of the first oxide layers 120 and 220 may be the same as or different from the widths or materials of the first through third peripheral region trenches 110a, 110b and 110c and cell region trenches 210. The first oxide layers 120 and 220 may be a typical sidewall oxide layer, or a multi-layer of a sidewall oxide layer and a mid temperature oxide (MTO) layer. The first oxide layers 120 and 220 may be a silicon oxide layer; however, the present invention is not limited thereto. In addition, the first oxide layers 120 and 220 may be formed using a silane-based gas, for example, $SiH_4$, $Si_2Cl_2H_2$, $SiH_6$, $Si_2H_6$ and/or $Si_3H_8$. Alternatively, the first oxide layers 120 and 220 may be formed using $O_2$, $N_2$, Ar and/or He. In addition, the first oxide layers 120 and 220 may be formed by thermal oxidation, rapid thermal oxidation (RTO) and/or chemical vapor deposition (CVD). However, the first oxide layers 120 and 220 as described above are for illustration purposes only, and the types thereof are not limited to the above examples. The first oxide layers 120 and 220 can reduce or prevent defects in sidewalls of the first through third peripheral region trenches 110a, 110b and 110c and the cell region trenches 210.

In addition, pad insulating layers 112 and 212 may be optionally further formed on the substrate 10. The pad insulating layers 112 and 212 may be formed prior to or after the formation of the first oxide layers 120 and 220. The pad insulating layers 112 and 212 may be a silicon oxide layer, a silicon nitride layer and/or a silicon oxynitride layer. As illustrated in FIG. 2B, in the case of sequentially forming the first oxide layers 120 and 220 and the pad insulating layers 112 and 212 on the substrate 10, the pad insulating layers 112 and 212 can reduce or prevent the first oxide layers 120 and 220 from being damaged in subsequent processes. Thus, a part of the first oxide layers 120 and 220 may be used as a gate insulating layer. In addition, the pad insulating layers 112 and 212 may be used as a planarization blocking layer in a subsequent planarization process, for example, in a chemical-mechanical polishing (CMP) process.

Figure 2C:
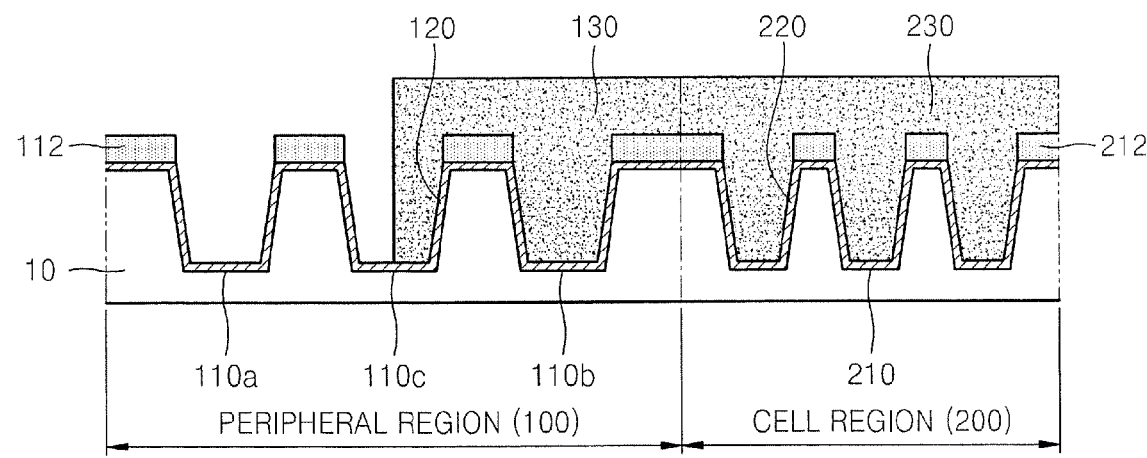
Figure 2D:
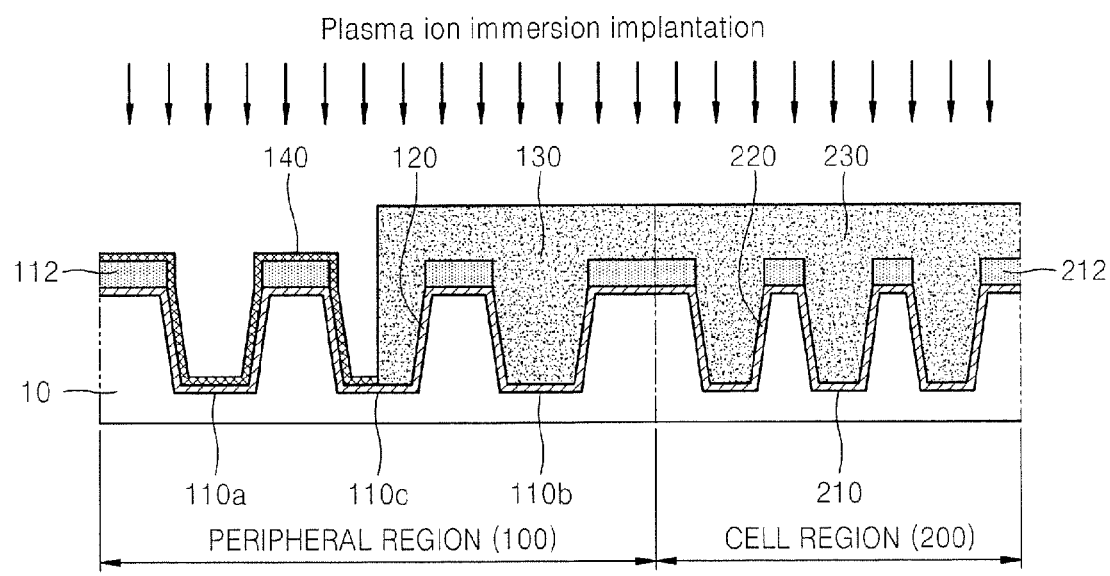

Referring to FIGS. 2C and 2D, a second oxide layer 140 is selectively formed on a portion of the first oxide layers 120 and 220, for example, on the first oxide layer 120 formed on the surface of the first peripheral region trenches 110a by plasma ion immersion implantation and deposition (PIIID). The PIIID will be described later in more detail.

The selective forming of the second oxide layer 140 will now be described, according to various embodiments of the present invention.

Referring to FIG. 2C, a photoresist layer (not shown) is formed on a top surface of the substrate 10 on which the first oxide layers 120 and 220 were previously formed, or on which the oxide layers 120 and 220 and the pad insulating layers 112 and 212 were previously formed. The photoresist layer is patterned to form photoresist patterns 130 and 230 to expose the first peripheral region trenches 110a and a portion of the third peripheral region trenches 110c. The patterning of the photoresist layer may be performed using a method that is commonly known in the art. The photoresist patterns 130 and 230 block the second peripheral region trenches 110b and the cell region trenches 210 from the outside.

Referring to FIG. 2D, the second oxide layer 140 is selectively formed on the first oxide layer 120, which is formed on the surface of the first peripheral region trenches 110a and exposed by the photoresist pattern 130, by using PIIID. The second oxide layer 140 may be a silicon oxide layer, but the present invention is not limited thereto. In addition, the second oxide layer 140 may be formed using a silane-based gas, for example, $SiH_4$, $Si_2Cl_2H_2$, $SiH_6$, $Si_2H_6$ and/or $Si_3H_8$. Alternatively, the second oxide layer 140 may be formed using $O_2$, $N_2$, Ar and/or He. However, these examples are for illustration purposes only, and the present invention is not limited thereto.

In addition, the PIIID may be performed at between about 10° C. to about 200° C. However, the PIIID is described for illustration purposes only, and any method that can be performed at less than about 200° C., for example, between about 100° C. to about 200° C., to form the oxide layer may be used. Since the second oxide layer 140 is formed at a low temperature, the photoresist patterns 130 and 230 may be used as a deposition mask. Accordingly, the second oxide layer 140 is selectively formed on the first oxide layer 120, or on the surfaces of the first trenches 110, but not on the first oxide layer 220, formed on the surfaces of the second trenches 210, using PIIID. The selective forming may be performed by forming a photoresist pattern 130/230 on the substrate, to expose the first trench 110 and cover the second trenches 210, and then forming the second oxide layer 140 on the first oxide layer 120, and on the surfaces of the exposed trenches 110, but not on the first oxide layer 220 formed on the surfaces of the covered second trenches 210.

Next, the photoresist patterns 130 and 230 are removed using a conventional method, for example, ashing or stripping. In addition, prior to the removing of the photoresist patterns 130 and 230, a second oxide layer (not shown) formed on the photoresist patterns 130 and 230 may be optionally removed by using dry etching.

Hereinafter, the oxide layers formed in the third peripheral region trenches 110c will be described. Similar to the case of the first peripheral region trenches 110a described above, the second oxide layer 140 may be selectively formed on the first oxide layer 120, which is formed on the surface of the third peripheral region trenches 110c and exposed, by using PIIID. However, unlike the first peripheral region trenches 110a, a part of the first oxide layer 120 formed on the surface of the third peripheral region trenches 110c is exposed by the photoresist pattern. Accordingly, as illustrated in FIG. 2D, one portion of the third peripheral region trenches 110c has the first oxide layer 120 and the second oxide layer 140 formed thereon, and the other portion thereof has only the first oxide layer 120 formed thereon, because the other portion thereof is blocked by the photoresist pattern. Whether to form the third peripheral region trenches 110c having layers formed thereon, which have such an asymmetric structure, is optional. Accordingly, the second oxide layer may be formed only on a portion of the first oxide layer and on the surfaces of a subset of the first trenches. Stated differently, PIIID may be selectively performed on a portion of a surface of at least one of the trenches in the substrate. Thus, an oxide liner is provided that fully lines first trenches 110a, does not line second trenches 110b/210 and partially lines third trenches 110c.

Figure 2E:
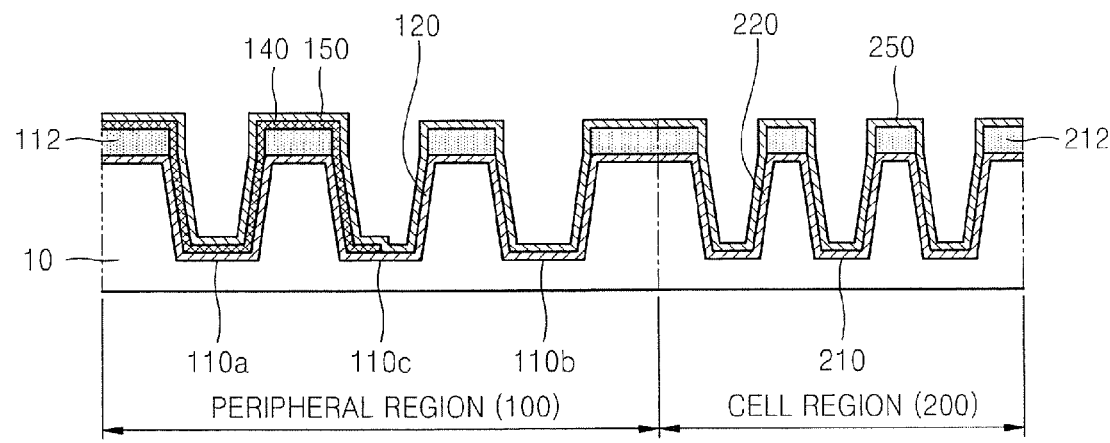

Referring to FIG. 2E, liner nitride layers 150 and 250 are formed on the first oxide layers 120 and 220 and the second oxide layer 140. The liner nitride layers 150 and 250 may be a silicon nitride layer and/or a silicon oxynitride layer, but the present invention is not limited thereto. Alternatively, the liner nitride layers 150 and 250 may be a thermal nitride layer and/or a chemical vapor deposition (CVD) nitride layer. For example, the liner nitride layers 150 and 250 may be formed using plasma enhanced CVD (PECVD), atomic layer deposition (ALD), or a radical nitridation method. The forming of the liner nitride layers 150 and 250 may be performed from about 100° C. to about 500° C., and from about 0.01 Torr to about 10 Torr pressure, by using a mixed gas of $N_2$, NO, $N_2O$ and/or $NH_3$ and one source gas selected from the group consisting of $SiH_4$, $Si_2Cl_2H_2$, $SiH_6$, $Si_2H_6$, and $Si_3H_8$, and in an Ar, He, or the like atmosphere. However, these examples are for illustration purposes only, and the present invention is not limited thereto.

Figure 2F:
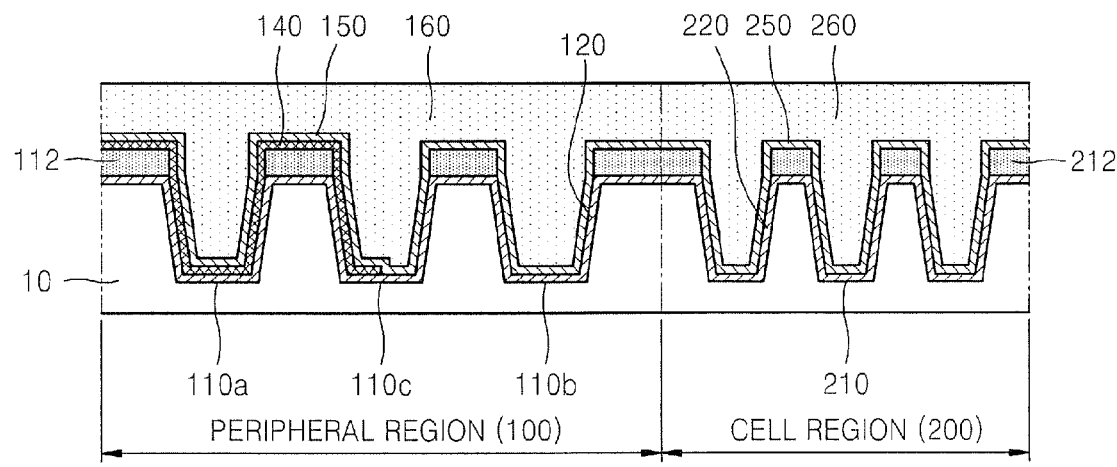

Referring to FIG. 2F, buried insulating layers 160 and 260 are formed in the first through third peripheral region trenches 110a, 110b and 110c and the cell region trenches 210. The buried insulating layers 160 and 260 may be an oxide layer, for example, spin-on-glass (SOG) and/or undoped silica glass (USG). In addition, the buried insulating layers 160 and 260 may be formed by high density plasma CVD (HDP-CVD), O3-TEOS atmospheric pressure CVD (O3-TEOS APCVD), O3-TEOS Sub-APCVD, atomic layer CVD (ALCVD) and/or molecular layer CVD (MLCVD).

Figure 2G:
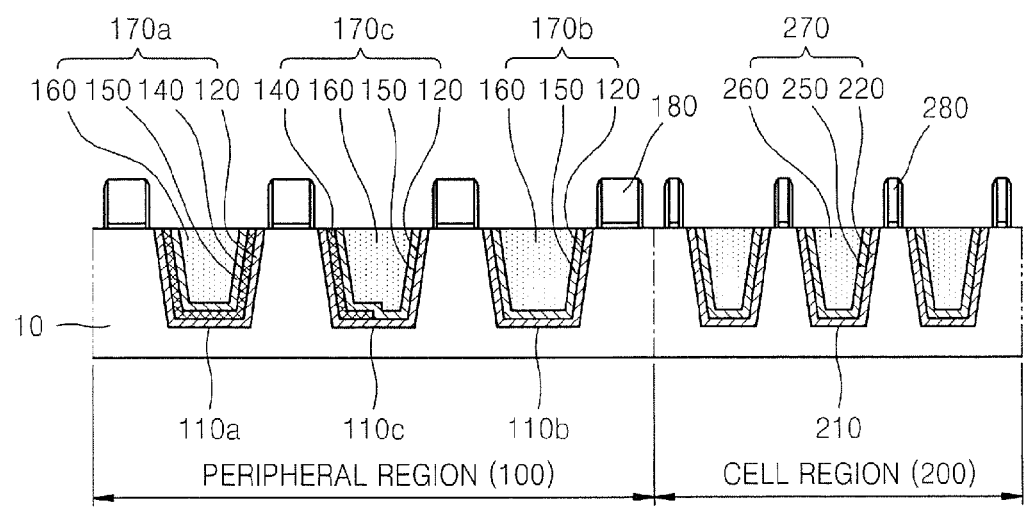

Referring to FIG. 2G, the buried insulating layers 160 and 260 are planarized by chemical-mechanical polishing (CMP) and/or an etch-back process to respectively form first through third peripheral region device isolation layers 170a, 170b and 170c and cell region device isolation layers 270 in the first through third peripheral region trenches 110a, 110b and 110c and the cell region trenches 210. Subsequently, peripheral region gate structures 180 are formed on regions on the substrate 10 between the first through third peripheral region device isolation layers 170a, 170b, and 170c. In addition, cell region gate structures 280 are formed on regions on the substrate 10 between the cell region device isolation layers 270. The peripheral region gate structures 180 and/or the cell region gate structures 280 may be a conventional transistor, a transistor of a conventional static random access memory (SRAM) or dynamic random access memory (DRAM) device and/or a transistor of a flash memory device.

Regions of the substrate 10 between the first peripheral region device isolation layers 170a may include a p-channel metal-oxide-semiconductor (p-MOS) region in which a p-MOS transistor is formed. Regions of the substrate 10 between the second peripheral region device isolation layers 170b may include an n-channel metal-oxide-semiconductor (n-MOS) region in which an n-MOS transistor is formed. In addition, regions of the substrate 10 between the cell region device isolation layers 270 may include an n-MOS region in which an n-MOS transistor is formed. In addition, when the third peripheral region device isolation layers 170c are included, regions of the substrate 10 between regions of the first peripheral region device isolation layers 170a and the third peripheral region device isolation layers 170c on which both the first oxide layer 120 and the second oxide layer 140 are formed may include a p-MOS region in which a p-MOS transistor is formed. In addition, regions of the substrate 10 between regions of the second peripheral region device isolation layers 170b and the third peripheral region device isolation layers 170c, which are the regions on which the second oxide layer 140 is not formed, may include an n-MOS region in which an n-MOS transistor is formed. That is, device isolation layers that define an active region in the substrate 10, for forming the p-MOS transistor, i.e., the first peripheral region device isolation layers 170a, include both the first oxide layer 120 and the second oxide layer 140. In addition, device isolation layers that define an active region in the substrate 10, for forming the n-MOS transistor, that is, the second peripheral region device isolation layers 170b and the cell region device isolation layers 270, do not include the second oxide layer 140 and accordingly, the second peripheral region device isolation layers 170b include only the first oxide layer 120 and the liner nitride layer 150 and the cell region device isolation layers 270 include only the first oxide layer 220 and the liner nitride layer 250. Also, in the case of the third peripheral region device isolation layers 170c having an asymmetric layer structure including the second oxide layer 140 on a portion of the surface thereof, the active region in the substrate 10, for forming the p-MOS transistor is defined adjacent to the region on which both the first oxide layer 120 and the second oxide layer 140 are formed in the third peripheral region device isolation layers 170c, while the active region in the substrate 10, for forming the n-MOS transistor is defined adjacent to the region on which the second oxide layer 140 is not formed in the third peripheral region device isolation layers 170c.

The structures described above may have the following sizes: First, the first through third peripheral region trenches 110a, 110b and 110c and the cell region trenches 210 may each be between about 1000 Å and about 3000 Å in depth. The pad insulating layers 112 and 212 may each be between about 50 Å and about 1000 Å in thickness. The first oxide layers 120 and 220 and the second oxide layer 140 may each be about 50 Å and about 200 Å in thickness. The buried insulating layers 160 and 260 may each be between about 3000 Å and about 6000 Å in thickness. However, the sizes described above are for illustration purposes only, and the present invention is not limited thereto.

Consequently, the device isolation layers that define the active region in the substrate for forming the p-MOS transistor include a relatively thicker oxide layer than the device isolation layers that define the active region in the substrate for forming the n-MOS transistor, and thus charge trapping by the liner nitride layer formed on the oxide layer can be reduced or prevented.

Hereinafter, the PIIID will be described in more detail. The PIIID is a method combining a vapor deposition process with an implantation process in which plasma-state ions are excited by bias voltage applied from the outside or by the plasma itself, thereby being accelerated and implanted into a substrate. The PIIID may be regarded as a combination of conventional ion implantation and plasma enhanced chemical vapor deposition (PECVD). By using the PIIID, a phase or layer that may not be deposited by general PECVD can be formed. In particular, by using the PIIID, a layer having a compact structure even at room temperature can be formed. That is, deposition and the like may be performed using a photoresist mask that may not be used at a high temperature.

Figure 3:
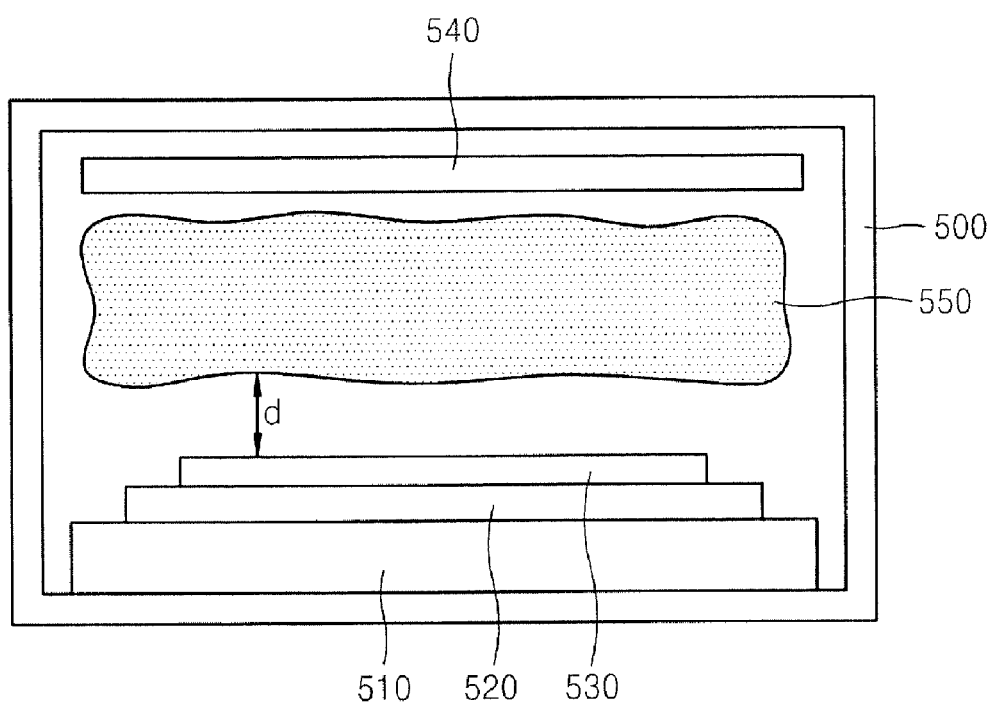
FIG. 3 is a schematic view of a plasma ion immersion implantation and deposition device, used to form an STI-type device isolation layer, according to some embodiments of the present invention.

FIG. 3 is a schematic view of a plasma ion immersion implantation deposition device used to form a device isolation layer, according to some embodiments of the present invention.

Referring to FIG. 3, the plasma ion immersion implantation deposition device includes a source electrode 540 and a cathode electrode 510 in a chamber 500, a platen 520 disposed between the source and cathode electrodes 540 and 510, and a substrate 530 on the platen 520. A source gas is excited to form plasma 550, and ions in the plasma 550 are implanted into the substrate 530. At this time, if a bias voltage is applied to the cathode electrode 510, the ions in the plasma 550 may be accelerated. Accordingly, desired ions to be implanted can be implanted simultaneously into a top surface of the substrate 530. In FIG. 3, "d" refers to a sheath gap. When a deposition gas is used as the source gas, deposition of a layer, instead of conventional ion implantation, is possible. The output of a plasma source may be in a range of about 0 W to about 3000 W, and the bias of the cathode electrode 510 may be in a range of about 0 kV to about 10 kV.

Figure 4A:
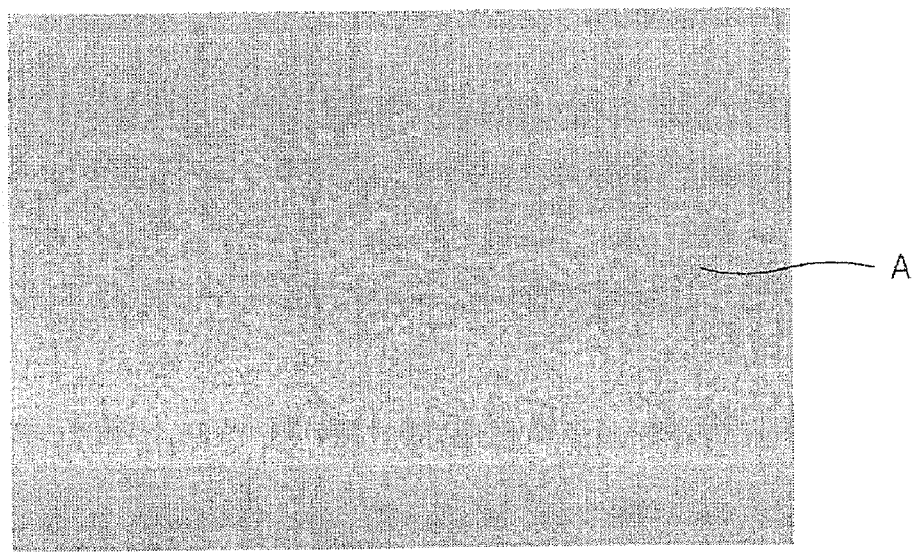
FIGS. 4A and 4B are images showing a surface of a low temperature deposited layer by respectively using plasma enhanced chemical vapor deposition (PECVD) and plasma ion immersion implantation and deposition.
Figure 4B:
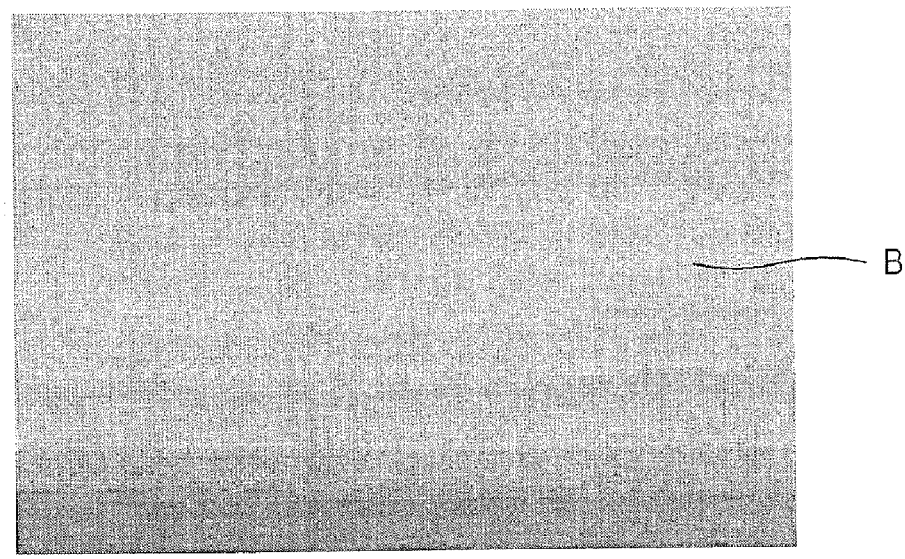

FIGS. 4A and 4B are images showing a surface of a low temperature deposited layer by respectively using plasma enhanced CVD (PECVD) and PIIID.

Referring to FIGS. 4A and 4B, the surface B of the layer formed by PIIID is more compact than the surface A of the layer formed by PECVD. Such a compact layer may be formed by adjusting or optimizing a flow amount of the source gas, the output of the plasma source and/or the applied bias voltage of the cathode electrode in the PIIID. Thus, unlike a conventional PECVD, the layer having such a compact structure may be formed even at a low temperature by using the PIIID.

Figure 5:
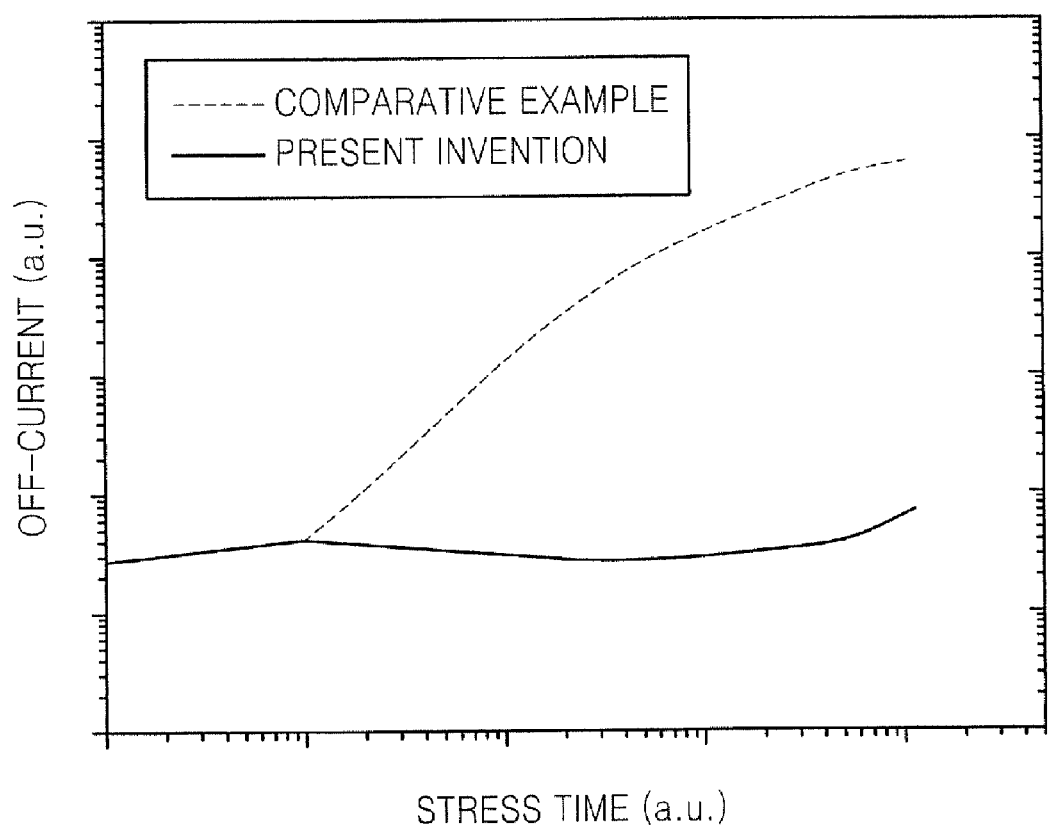
FIG. 5 is a graph showing a change in off-current with respect to stress time of a semiconductor device including an STI-type device isolation layer, according to some embodiments of the present invention.

FIG. 5 is a graph showing a change in off-current with respect to stress time of a semiconductor device including device isolation layers, according to various embodiments of the present invention.

Referring to FIG. 5, in the case of a conventional semiconductor device, the longer the stress time, the higher the off-current, and this was derived from the degradation of the semiconductor device due to hot electron induced punch through (HEIP). On the other hand, in the case of a semiconductor device manufactured by embodiments of the present invention, even when the stress time increased, the off-current was nearly uniform, and this means that the impact by the HEIP was decreased and as a result, the reliability of the semiconductor device was increased.

To reduce the impact by the HEIP, a method of forming an oxide layer having sufficient thickness between the surface of a substrate and a nitride layer formed thereon in a device isolation layer may be provided. However, in the device isolation layers formed in the cell region, the oxide layer may have a limited thickness, and n-MOS transistors in which the effect of the HEIP is relatively low are primarily formed in the cell region. Thus, according to various embodiments of the present invention, the oxide layer in the device isolation layers of p-MOS transistors formed in the peripheral region is selectively formed to be thick. However, these examples are for illustration purposes only, and the present invention is not limited thereto.

In methods of manufacturing semiconductor devices, according to various embodiments of the present invention, some of device isolation layers, for example, the device isolation layers that define the active region in the substrate for forming the p-MOS transistor, include a relatively thicker oxide layer than the device isolation layers that define the active region in the substrate for forming the n-MOS transistor, and thus electron trapping by the liner nitride layer formed on the oxide layer can be reduced or prevented. Accordingly, not only are the refresh properties of cells not decreased, but HEIP can also be reduced or prevented, and the reliability of the device can be improved.

In addition, another oxide layer formed on the oxide layer is formed at a low temperature, and thus relatively simple and inexpensive photoresist patterning technology can be used, and the degradation of the device at high temperature can be decreased.

The foregoing is illustrative of exemplary embodiments and is not to be construed as limitations thereof. Although example embodiments have been described, those of ordinary skill in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of exemplary embodiments and is not to be construed as being limited to the specific embodiments disclosed, and that modifications to the disclosed embodiments, as well as other embodiments, are intended to be included within the scope of the appended claims. Exemplary embodiments are defined by the following claims, with equivalents of the claims to be included therein.

The invention claimed is:

1. A method of manufacturing a semiconductor device, the method comprising:
   forming first trenches and second trenches in a substrate;
   forming a first oxide layer on the surfaces of the first trenches and the second trenches;
   selectively forming a second oxide layer on the first oxide layer formed on the surfaces of the first trenches but not on the first oxide layer formed on the surfaces of the second trenches, by using selective plasma ion immersion implantation and deposition (PIIID);
   forming a liner nitride layer on the first oxide layer on the surfaces of the second trenches and on the second oxide layer on the surfaces of the first trenches;
   forming a buried insulating layer in the first trenches and the second trenches; and
   planarizing the buried insulating layer to form a first device isolation layer in the first trenches and a second device isolation layer in the second trenches,
   wherein the selective forming of the second oxide layer further comprises:
   forming a photoresist pattern on the substrate to expose the first trenches and cover the second trenches;
   forming the second oxide layer on the first oxide layer formed on the surfaces of the exposed first trenches but not on the first oxide layer formed on the surfaces of the covered second trenches by using plasma ion immersion implantation and deposition (PIIID);
   removing the second oxide layer formed on the photoresist pattern by using dry etching; and then
   removing the photoresist pattern.

2. The method of claim 1, wherein the plasma ion immersion implantation and deposition (PIIID) is performed at between about 10° C. to about 200° C.

3. The method of claim 1, wherein the second oxide layer is formed using $SiH_4$, $Si_2Cl_2H_2$, $SiH_6$, $Si_2H_6$, $Si_3H_8$, $O_2$, $N_2$, Ar and/or He.

4. The method of claim 1, wherein a region of the substrate between the first device isolation layers comprises a p-channel metal-oxide-semiconductor (p-MOS) region in which a p-MOS transistor is formed, and
   wherein a region of the substrate between the second device isolation layers comprises an n-channel metal-oxide-semiconductor (n-MOS) region in which an n-MOS transistor is formed.

5. The method of claim 1 further comprising forming third trenches, wherein the second oxide layer is formed on a portion of the first oxide layer formed on the surfaces of the third trenches, and third device isolation layers are formed in the third trenches.

6. The method of claim 5, wherein regions on the substrate between the first device isolation layers and a portion of the third device isolation layers having both the first oxide layer and the second oxide layer formed therein comprise a p-MOS region in which a p-MOS transistor is formed, and wherein regions on the substrate between the second device isolation layers and a portion of the third device isolation layers having the first oxide layer formed therein comprise an n-MOS region in which an n-MOS transistor is formed.

7. The method of claim 1, further comprising forming a pad insulating layer on the substrate.

8. A method of manufacturing a semiconductor device, the method comprising:

forming first peripheral region trenches and second peripheral region trenches in a peripheral region of a substrate;

forming cell region trenches in a cell region of the substrate;

forming a first oxide layer on the surfaces of the first peripheral region trenches, the second peripheral region trenches and the cell region trenches;

selectively forming a second oxide layer on the first oxide layer formed on the surfaces of the first peripheral region trenches but not on the first oxide layer formed on the surfaces of the second peripheral region trenches and not on the first oxide layer formed on the surfaces of the cell region trenches by using plasma ion immersion implantation and deposition (PIIID);

forming a liner nitride layer on the first oxide layer and the second oxide layer;

forming a buried insulating layer in the first peripheral region trenches, the second peripheral region trenches and the cell region trenches; and planarizing the buried insulating layer to form a first peripheral region device isolation layer in the first peripheral region trenches, a second peripheral region device isolation layer in the second peripheral region trenches and a cell region device isolation layer in the cell region trenches, wherein the selective forming of the second oxide layer further comprises:

forming a photoresist pattern on the substrate to expose the first peripheral region trenches but to cover the second peripheral region trenches and the cell region trenches;

forming the second oxide layer on the first oxide layer formed on the surface of the exposed first peripheral region trenches but not on the first oxide layer formed on the surfaces of the covered second peripheral region trenches and cell region trenches by using the plasma ion immersion implantation and deposition (PIIID);

removing the second oxide layer formed on the photoresist pattern by using dry etching; and then removing the photoresist pattern.

9. The method of claim 8, wherein sizes of the first peripheral region trenches and the second peripheral region trenches are larger than a size of the cell region trenches.

10. The method of claim 8, wherein the plasma ion immersion implantation and deposition (PIIID) is performed at between about 10° C. to about 200° C.

11. The method of claim 8, wherein the second oxide layer is formed using $SiH_4$, $Si_2Cl_2H_2$, $SiH_6$, $Si_2H_6$, $Si_3H_8$, $O_2$, $N_2$, Ar and/or He.

12. The method of claim 8, wherein regions on the substrate between the first peripheral region device isolation layers comprise a p-MOS region in which a P-MOS transistor is formed, wherein regions on the substrate between the second peripheral region device isolation layers comprise an n-MOS region in which an n-MOS transistor is formed, and wherein regions on the substrate between the cell region device isolation layers comprise an n-MOS region in which an n-MOS transistor is formed.

13. The method of claim 8 further comprising forming third peripheral region trenches, wherein the second oxide layer is formed on a portion of the first oxide layer formed on the surface of the third peripheral region trenches, and third device isolation layers are formed in the third peripheral region trenches.

14. The method of claim 13, wherein regions on the substrate between the first peripheral region device isolation layers and a portion of the third peripheral region device isolation layers having both the first oxide layer and the second oxide layer formed therein comprise a p-MOS region in which a p-MOS transistor is formed, and wherein regions on the substrate between the second peripheral region device isolation layers and a portion of the third peripheral region device isolation layers having the second oxide layer not formed therein comprise an n-MOS region on which an n-MOS transistor is formed.

15. The method of claim 8, further comprising forming a pad insulating layer on the substrate.

16. The method of claim 8, further comprising:

forming a peripheral region gate structure on regions of the substrate between the first peripheral region device isolation layers and the second peripheral region device isolation layers; and forming a cell region gate structure on regions of the substrate between the cell region device isolation layers.

* * * * *